United States Patent
Cho et al.

(10) Patent No.: US 11,681,458 B2
(45) Date of Patent: Jun. 20, 2023

(54) MEMORY DEVICE AND METHOD READING DATA

(71) Applicant: SAMSUNG ELECTRONICS CO., LTD., Suwon-si (KR)

(72) Inventors: Sunghye Cho, Hwaseong-si (KR); Kijun Lee, Seoul (KR); Sung-Rae Kim, Seoul (KR); Chanki Kim, Suwon-si (KR); Yeonggeol Song, Seoul (KR); Yesin Ryu, Seoul (KR); Jaeyoun Youn, Seoul (KR); Myungkyu Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 170 days.

(21) Appl. No.: 17/090,726

(22) Filed: Nov. 5, 2020

(65) Prior Publication Data

US 2021/0334033 A1 Oct. 28, 2021

(30) Foreign Application Priority Data

Apr. 27, 2020 (KR) .................. 10-2020-0050991

(51) Int. Cl.
*G06F 11/00* (2006.01)
*G06F 3/06* (2006.01)
*G06F 11/10* (2006.01)
*G11C 29/52* (2006.01)

(52) U.S. Cl.
CPC .......... *G06F 3/0655* (2013.01); *G06F 3/0619* (2013.01); *G06F 3/0673* (2013.01); *G06F 11/1048* (2013.01); *G11C 29/52* (2013.01)

(58) Field of Classification Search
CPC ............ G06F 11/1048; G06F 11/1004; G06F 11/1012; G06F 11/1024; G11C 29/52
See application file for complete search history.

(56) References Cited

U.S. PATENT DOCUMENTS

| | | | |
|---|---|---|---|
| 4,604,751 A | 8/1986 | Aichelmann, Jr. et al. | |
| 4,653,052 A * | 3/1987 | Doi ........................ | H03M 13/29 714/755 |
| 4,661,955 A * | 4/1987 | Arlington ............ | H03M 13/033 714/E11.046 |
| 4,742,517 A * | 5/1988 | Takagi ................ | G11B 20/1809 |
| 5,247,523 A * | 9/1993 | Arai ...................... | H03M 13/03 714/755 |
| 5,684,810 A * | 11/1997 | Nakamura ............ | H03M 13/15 714/755 |
| 6,138,263 A * | 10/2000 | Kodama ............... | H03M 13/00 714/769 |

(Continued)

*Primary Examiner* — Loan L. T. Truong
(74) *Attorney, Agent, or Firm* — Volentine, Whitt & Francos, PLLC

(57) ABSTRACT

A method for reading data from a memory includes; reading a codeword from the memory cells, correcting the errors when a number of errors in the codeword is less than a maximum number of correctable errors, correcting the errors when the number of errors in the codeword is equal to the maximum number of correctable errors and the errors correspond to a same sub-word line, and outputting signal indicating that the errors are an uncorrectable error when the number of errors of the codeword is equal to the maximum number of correctable errors and the errors correspond to different sub-word lines.

16 Claims, 14 Drawing Sheets

(56) References Cited

U.S. PATENT DOCUMENTS

| | | | |
|---|---|---|---|
| 8,291,297 B2 | 10/2012 | Coulson et al. | |
| 8,516,339 B1 | 8/2013 | Lesea et al. | |
| 8,762,821 B2 | 6/2014 | Wu et al. | |
| 8,781,800 B2 | 7/2014 | Chavda et al. | |
| 8,873,288 B2 | 10/2014 | Sharon et al. | |
| 8,914,708 B2 | 12/2014 | Meaney et al. | |
| 9,996,412 B2* | 6/2018 | Zhang | G06F 11/10 |
| 10,432,230 B2* | 10/2019 | Bueb | H03M 13/29 |
| 10,567,003 B2* | 2/2020 | Brueggen | H03M 13/6561 |
| 2008/0148126 A1* | 6/2008 | Eilert | H03M 13/134 |
| | | | 714/E11.038 |
| 2009/0193296 A1* | 7/2009 | Kellington | G06F 11/261 |
| | | | 714/33 |
| 2012/0240013 A1* | 9/2012 | Wong | H04L 1/1861 |
| | | | 714/E11.032 |
| 2013/0111303 A1* | 5/2013 | Avudaiyappan | H03M 13/15 |
| | | | 714/E11.032 |
| 2013/0326304 A1* | 12/2013 | Bueb | H03M 13/29 |
| | | | 714/755 |
| 2014/0047265 A1* | 2/2014 | Das | G06F 11/1666 |
| | | | 714/54 |
| 2014/0258804 A1* | 9/2014 | Pangal | G06F 11/1076 |
| | | | 714/752 |
| 2016/0179577 A1* | 6/2016 | Catthoor | G06Q 10/04 |
| | | | 718/104 |
| 2017/0257121 A1* | 9/2017 | Kwok | H03M 13/451 |
| 2018/0203625 A1* | 7/2018 | Zhang | H03M 13/2927 |
| 2018/0278273 A1* | 9/2018 | Kifune | H03M 13/2948 |
| 2019/0044541 A1* | 2/2019 | Kwok | H03M 13/1515 |
| 2019/0102254 A1 | 4/2019 | Saxena | |
| 2019/0229753 A1 | 7/2019 | Cha | |
| 2020/0106460 A1* | 4/2020 | Ku | H03M 13/1575 |
| 2020/0210284 A1* | 7/2020 | Somasekhar | G06F 11/1012 |
| 2021/0202012 A1* | 7/2021 | Han | G06F 11/1048 |
| 2021/0399744 A1* | 12/2021 | Kwok | H03M 13/255 |
| 2022/0083470 A1* | 3/2022 | Jeon | G06F 3/0673 |
| 2022/0100395 A1* | 3/2022 | Kim | G11C 29/42 |
| 2022/0139485 A1* | 5/2022 | Kim | G06F 11/1068 |
| | | | 714/719 |

* cited by examiner

MEMORY DEVICE AND METHOD READING DATA

CROSS-REFERENCE TO RELATED APPLICATIONS

This application claims priority under 35 U.S.C. § 119 to Korean Patent Application No. 10-2020-0050991 filed on Apr. 27, 2020 in the Korean Intellectual Property Office, the subject matter of is hereby incorporated by reference.

BACKGROUND

Embodiments of the inventive concept relate generally to semiconductor devices. More particularly, embodiments of the inventive concept relate to memory devices capable of preventing data corruption, as well as methods of reading data from a memory device that prevent data corruption.

Memory devices are widely used to store data. A processor may store data in a memory device and read the data from the memory device. Error(s) may occur during the writing (or programming) of data in the memory device, while the data is stored in the memory device, and/or during the reading of data from the memory device.

Memory devices may perform error correction encoding and/or error correction decoding (hereafter, singularly or collectively, "ECC") in order to correct errors occurring in data. ECC may be performed during the writing of data in the memory device. ECC may be performed as part of data processing that provides supplemental information related to the data that may later be used to correct error(s) in the data.

Alternately or additionally, ECC may be is performed during the reading of data from the memory device. Here, ECC may be used to detect data error(s) in the read data, and correct the data error(s) using the supplemental information. In this regard, ECC may be designed to correct a certain number of data errors.

However, sometimes data error(s) remain undetected and/or uncorrected despite the use of ECC during the reading of data from conventional memory devices. This outcome may be referred to as "silent data corruption or SDC". There are many possible causes for SDC, but SDC results in at least one data error that is incapable of being detected and/or corrected.

SUMMARY

Embodiments of the inventive concept provide memory devices capable of preventing SDC and related methods for reading data from the memory devices.

According to an exemplary embodiment, a memory device includes; a memory chip including memory cells and a logic chip configured to control the memory chip. The logic chip reads a codeword including N data units from the memory chip, and perform error correction decoding on the codeword to correct errors in M data units of the N data units, such that when the M data units correspond to a common component of the memory chip, the logic chip is configured to correct the errors of the M data units, and when the M data units do not correspond to the common component of the memory chip, the logic chip is configured to process the errors of the M data units as an uncorrectable error.

According to an exemplary embodiment, a memory device includes a memory chip including memory cells and a logic chip configured to control the memory chip. The logic chip is configured to read a codeword including N data units from the memory chip, and perform error correction decoding on the codeword to correct errors in M data units of the N data units, such that when the M data units do not correspond to a data corruption pattern, the logic chip is configured to correct the errors of the M data units, and when the M data units correspond to the data corruption pattern, the logic chip is configured to process the errors of the M data units as an uncorrectable error.

According to an exemplary embodiment, a method for reading data from a memory device including memory cells includes; reading a codeword from the memory cells, correcting the errors when a number of errors in the codeword is less than a maximum number of correctable errors, correcting the errors when the number of errors in the codeword is equal to the maximum number of correctable errors and the errors correspond to a same sub-word line, and outputting signal indicating that the errors are an uncorrectable error when the number of errors of the codeword is equal to the maximum number of correctable errors and the errors correspond to different sub-word lines.

BRIEF DESCRIPTION OF THE DRAWINGS

The above and other objects and features of the inventive concept will become apparent by describing in detail exemplary embodiments thereof with reference to the accompanying drawings.

DETAILED DESCRIPTION

Certain embodiments of the inventive concept will now be described in some additional detail with reference to the accompanying drawings.

Figure 1:
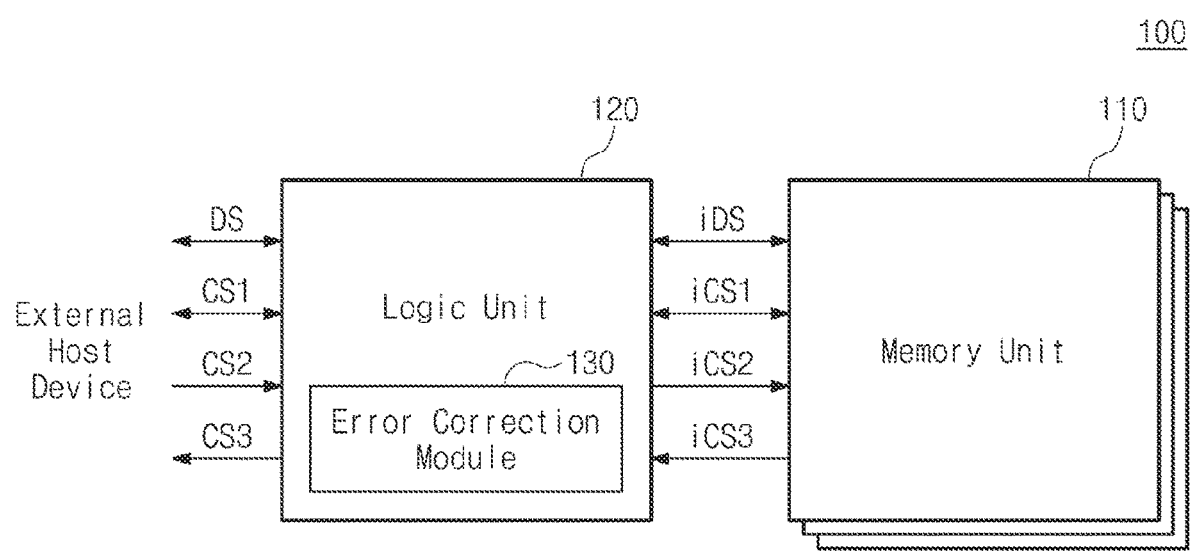
FIGS. 1 and 14 are respective block diagrams illustrating memory devices according to embodiments of the inventive concept.

Figure (FIG. 1 is a block diagram illustrating a memory device 100 according to embodiments of the inventive concept. Referring to FIG. 1, the memory device 100 may include memory units 110 and a logic unit 120, wherein the logic unit 120 is configured to control operation of the memory units 110.

In this regard, the memory units 110 may exchange: (1) internal data signal iDS with the logic unit 120 through first signal lines; (2) first internal control signals iCS1 with the logic unit 120 through second signal lines; (3) second internal control signals iCS2 with the logic unit 120 through third signal lines; and/or (4) third internal control signals iCS3 with the logic unit 120 through fourth signal lines.

Here, the memory units 110 may operate in response to the first internal control signals iCS1, the second internal control signals iCS2, and/or the third internal control signals iCS3. For example, the first internal control signals iCS1, the second internal control signals iCS2, and the third internal control signals iCS3 may variously and respectively include clock signal(s), command(s), address(es), and/or control signal(s) necessary to the operation of the memory units 110.

The memory units 110 may perform a write operation in response to the internal data signal iDS and a write command received from the logic unit 120. The memory units 110 may perform a read operation in response to a read command received from the logic unit 120. Here, individual memory units 110 may be selectively activated by the logic unit 120 during various operations.

As illustrated in FIG. 1, the logic unit 120 may be connected between an external host device and the memory units 110. The logic unit 120 may exchange: (1) data signals DS with the external host device through fifth signal lines; (2) first control signals CS1 with the external host device through sixth signal lines; (3) second control signals CS2 with the external host device through seventh signal lines; and/or (4) third control signals CS3 with the external host device through eighth signal lines.

Thus, the logic unit 120 may transfer the data signals DS received from the external host device to the memory units 110 as the internal data signals iDS, and may transfer the internal data signals iDS received from the memory units 110 to the external host device as the data signals DS. Alternately or additionally, the logic unit 120 may transfer the first control signals CS1 received from the external host device to the memory units 110 as the first internal control signals iCS1. The logic unit 120 may also transfer the first internal control signals iCS1 received from the memory units 110 to the external host device as the first control signals CS1. In similar manner, the logic unit 120 may transfer the second control signals CS2 as the second internal control signals iCS2; may transfer the second internal control signals iCS2 as the second control signals CS2; may transfer the third control signals CS3 as the third internal control signals iCS3; and may transfer the third internal control signals iCS3 as the third control signals CS3.

With this configuration, the logic unit 120 may effectively manage the operation of the memory units 110. For example, the logic unit 120 may be used to manage the provision of power, command(s), data signal(s), address signal(s) and/or control signal(s) to the respective memory units 110. The logic unit 120 may also perform various housekeeping, security and maintenance functions that protect and optimize performance of the memory units 110. In this regard, the logic unit 120 may be understood as a redistribution layer (or component) that organizes and properly distributes various signals among the memory units 110.

In certain embodiments of the inventive concept, the logic unit 120 may include an error correction module 130. The error correction module 130 may be variously configured, but is capable of performing error correction encoding on the data signals DS received from the external host device in order to provide encoded data as the internal data signals iDS.

The error correction module 130 may also be used to perform error correction decoding on the internal data signals iDS received from the memory units 110 in order to provide decoded data as the data signals DS. When performing error correction decoding, the logic unit 120 may identify the risk of SDC. That is, a functional component (implemented in hardware, firmware and/or software) within the logic unit 120 may be used to process incoming and outgoing data, and from the data being processed, identify the risk of SDC occurring. In this manner, embodiments of the inventive concept may prevent SDC.

In some embodiments, the memory device 100 of FIG. 1 may be a so-called high bandwidth memory (HBM). In this regard, the constituent memory units 110 may be stacked on the logic unit 120, and variously connected with the logic unit 120 through a number of through-silicon vias (TSV).

In the description that follows, a HBM will be assumed as an illustrative example of many other types of memory devices that may benefit from the teachings of the inventive concept. In this regard, the inventive concept may be applied to any memory device performing ECC and/or including an error correction module.

Figure 2:
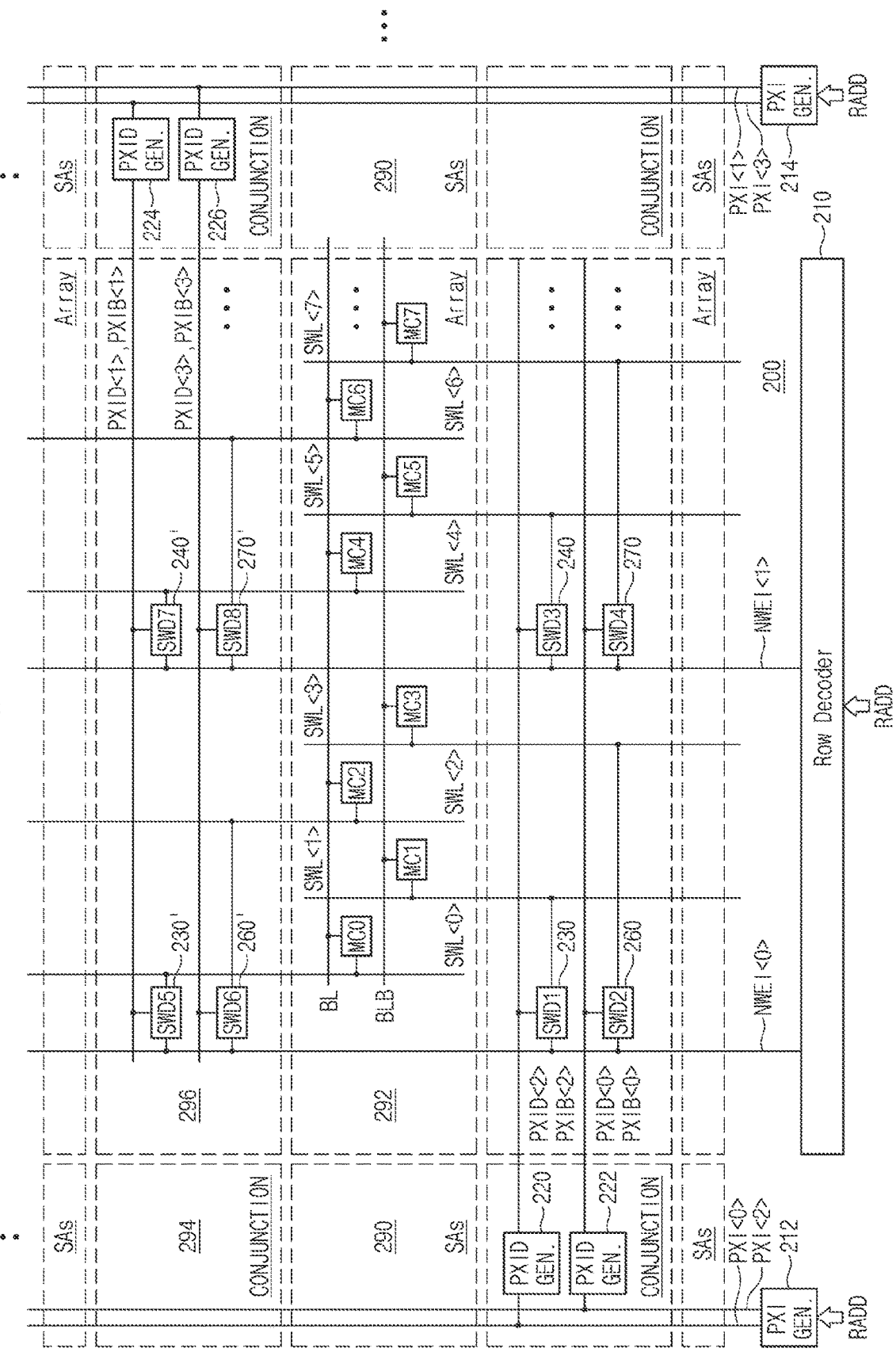
FIG. 2 is a circuit diagram illustrating a core structure for a memory unit according to embodiments of the inventive concept.

FIG. 2 is a circuit diagram illustrating a core structure for a memory unit 200 according to embodiments of the inventive concept. Here, the memory unit 200 may be one of the memory units 110 described in relation to FIG. 1.

Referring to FIGS. 1 and 2, the memory unit 200 may include a row decoder 210, pre-decoders 212 and 214, driving voltage generators 220, 222, 224, and 226, sub-word line drivers 230, 240, 260, and 270, sense amplifier blocks 290, a cell array 292, and conjunctions 294.

The row decoder 210 may be used to select a word line of a memory cell to be accessed (e.g., selected memory cell) in response to an input row address RADD. The row decoder 210 decodes the input row address RADD to generate word line enable signals NWEI<k>, wherein is a non-negative integer, for enabling a corresponding word line. The word line enable signals NWEI<k> provided by the row decoder 210 may be activated in a write operation mode and/or a read operation mode in relation to the selected memory cell. Alternately, in a self-refresh operation mode, the row decoder 210 may decode a row address RADD generated from an address counter (not illustrated) and may enable a corresponding word line.

The pre-decoders 212 and 214 may be used to generate pre-decoding signals PXI<0>, PXI<1>, PXI<2>, PXI<3>, etc., in response to the row address RADD. For example, the pre-decoders 212 and 214 may decode lower bits of the row address RADD to generate pre-decoding signals PXI<j>, wherein 'j' is a non-negative integer corresponding to a selected word line. The pre-decoding signals PXI<j> are provided to the driving voltage generators 220, 222, 224, and 226 within the conjunctions 294 through main word lines.

The driving voltage generators 220, 222, 224, and 226 may be used to generate driving signals PXID<i> and PXIB<i> for driving a word line in response to the pre-decoding signals PXI<0>, PXI<1>, PXI<2>, PXI<3>, etc. Each of the driving voltage generators 220, 222, 224, and 226 includes a pull-up driver supplying a high voltage (e.g., VPP) to the selected word line. In some embodiments, the pull-up driver may be implemented with a P-type Metal Oxide Semiconductor (PMOS) transistor.

The sub-word line drivers 230, 240, 260, and 270 may be used to activate (or precharge) the selected word line in response to the word line enable signals NWEI<k> and the driving signals PXID<i> and PXIB<i>. In a case where a memory cell MC1 is selected, the word line enable signal NWEI<O>is activated, and the driving signals PXID<2> and PXIB<2> provided from the driving voltage generator 220 are activated. In this case, the sub-word line driver 230 may drive a sub-word line SWL<0> with the high voltage VPP (i.e., the level of the driving signal PXID<2>). The operation of the sub-word line driver 230 may be the same as operations of the remaining sub-word line drivers 240, 260, 270, 230', 240', 260', and 270'.

The sense amplifier block 290 may be used to access a memory cell through a bit line pair BL and BLB of a selected column in response to a column address. Also, the sense amplifier block 290 may further include components for storing input data in a selected memory cell. The sense amplifier block 290 may rewrite data stored in a memory cell during a self-refresh mode. In some embodiments, the sense amplifier block 290 may be connected with memory cells in an open bit line structure.

The cell array 292 includes memory cells MC connected by the sub-word lines SWL and bit lines BL and arranged in a row direction and a column direction. Each of the memory cells MC may include a cell capacitor and an access transistor. In each memory cell, a gate of the access transistor is connected with one of the sub-word lines SWL extending in the row direction. A first end of the access transistor is connected with a bit line BL or a complementary bit line BLB extending in the column direction. A second end of the access transistor is connected with the cell capacitor.

Figure 3:
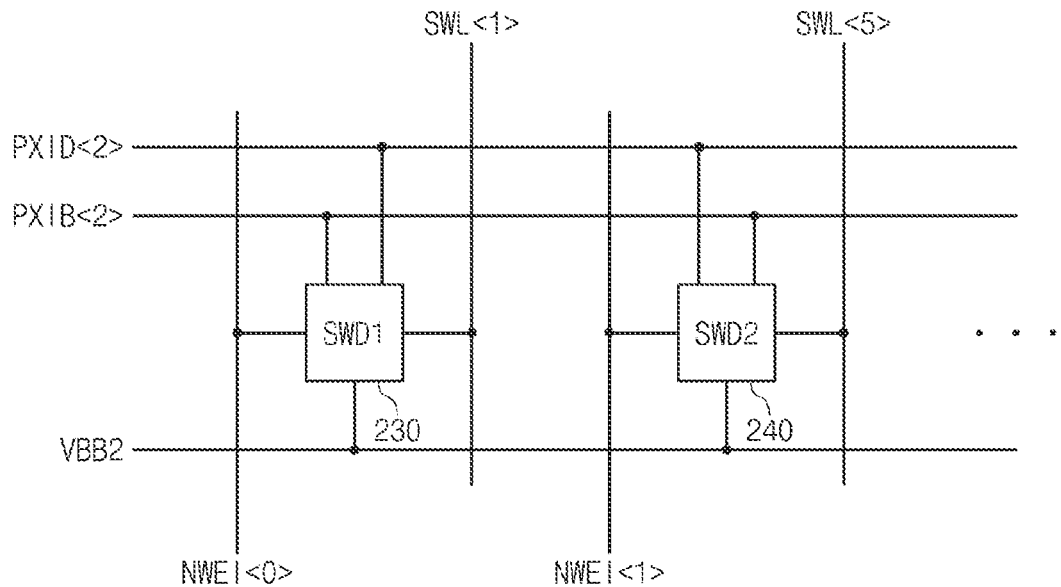
FIG. 3 is a block diagram illustrating adjacent sub-word line drivers according to embodiments of the inventive concept.

FIG. 3 is a block diagram further illustrating in one example an arrangement of adjacent sub-word line drivers according to embodiments of the inventive concept. Here, the sub-word line drivers 230 and 240 respectively driving the sub-word lines SWL<1> and SWL<5> are assumed to be adjacent.

All the sub-word line drivers 230 and 240 may be provided with the driving signals PXID<2> and PXIB<2>. Thus, the sub-word line driver 230 may be activated in response to the word line enable signal NWEI<0>, and the sub-word line driver 240 may be activated in response to the word line enable signal NWEI<1>. When the word line enable signal NWEI<0> is activated at a low level (hereafter, "low"), the sub-word line driver 230 provides the sub-word line SWL<1> with the high voltage VPP provided through the driving signal PXID<2>. Also, when the word line enable signal NWEI<0> is provided with a high level "H" (hereafter, "high"), the sub-word line driver 230 may block the driving signal PXID<2> and may precharge the sub-word line SWL<1> with a negative voltage VBB2.

Likewise, if a low word line enable signal NWEI<1> is provided, the sub-word line driver 240 provides the sub-word line SWL<5> with the high voltage VPP provided through the driving signal PXID<2>. And when a high word line enable signal NWEI<1> is provided, the sub-word line driver 240 may block the driving signal PXID<2> and may precharge the sub-word line SWL<5> with the negative voltage VBB2.

Figure 4:
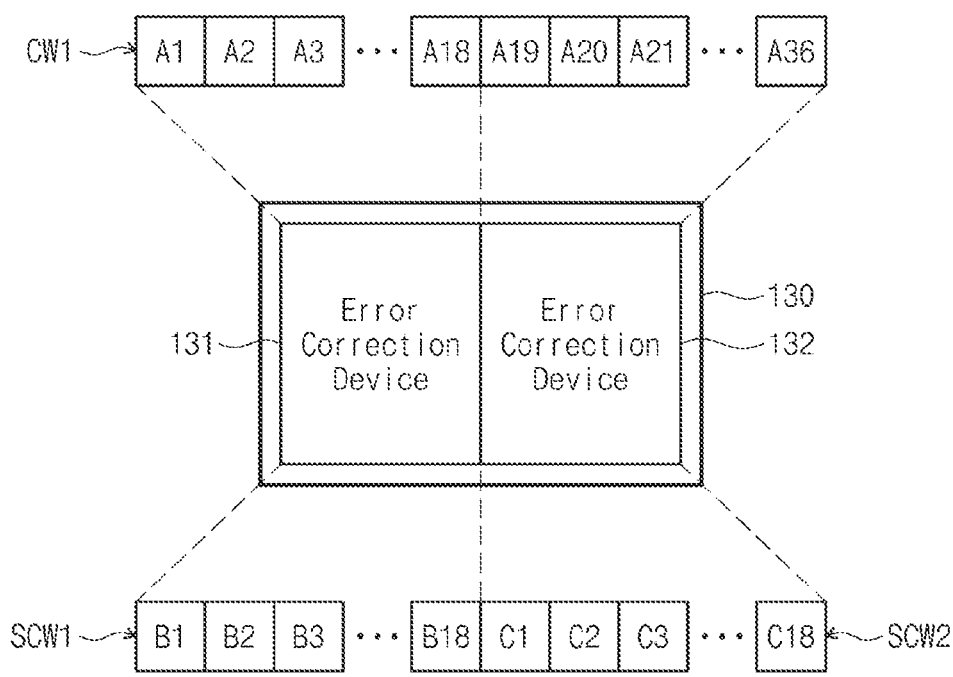
FIGS. 4 and 9 are respective conceptual diagrams illustrating examples of error correction modules performing error correction encoding/decoding according to embodiments of the inventive concept.

FIG. 4 is a conceptual diagram illustrating an example in which the error correction module 130 performs error correction encoding and error correction decoding according to embodiments of the inventive concept. Referring to FIGS. 1 and 4, the error correction module 130 may include a first error correction device 131 and a second error correction device 132. Each of the first error correction device 131 and the second error correction device 132 may perform error correction encoding/decoding using a Reed-Solomon code, for example.

In the illustrated example of FIG. 4, the error correction module 130 receives a first codeword CW1 including first (or 'N') data units (e.g., A1 to A36) as the data signals DS. Each of the first data units may be include (e.g.,) an 8-bit symbol. Alternately, each of the first data units may include one or more bits.

During the write operation, the first error correction device 131 may perform error correction encoding on some (i.e., a first set) of the first data units (e.g., A1 to A18) in order to generate a first sub-codeword SCW1 including second data units (e.g., B1 to B18). The second error correction device 132 may perform error correction encoding on the remaining (i.e., a second set) of the first data units (e.g., A19 to A36) in order to generate a second sub-codeword SCW2 including third data units (e.g., C1 to C18).

Thereafter, the logic unit 120 may transmit the first sub-codeword SCW1 and the second sub-codeword SCW2 to the memory units 110 as the internal data signals iDS. One of the memory units 110 may store the first sub-codeword SCW1 and the second sub-codeword SCW2.

During the read operation, the logic unit 120 may receive the first sub-codeword SCW1 and the second sub-codeword SCW2 from the memory units 110. The first error correction device 131 may perform error correction decoding on the second data units B1 to B18 of the first sub-codeword SCW1 in order to regenerate the first set of the first data units (e.g., A1 to A18). And the second error correction device 132 may perform error correction decoding on the third data units C1 to C18 of the second sub-codeword SCW2 in order to regenerate the second set data of the first data units (e.g., A19 to A36).

In some embodiments, the first error correction device 131 may detect and/or correct error(s) in a data set including (e.g.,) 18 data units. Likewise, the second error correction device 132 may detect and/or correct error(s) in a data set including (e.g.,) 18 data units. However, those skilled in the art will recognize that the number of data units that may be operated on by each of the first error correction device 131 and the second error correction device 132 is a matter of specific design (e.g., any number greater than 1).

In some embodiments, parity data may be used during the error correction encoding. The parity data may be variously defined and provided (e.g.,) as an additional data unit, or as additional bit within each data unit, etc. Those skilled in the art are deemed to understand the definition, generation and use of parity data.

Figure 5:
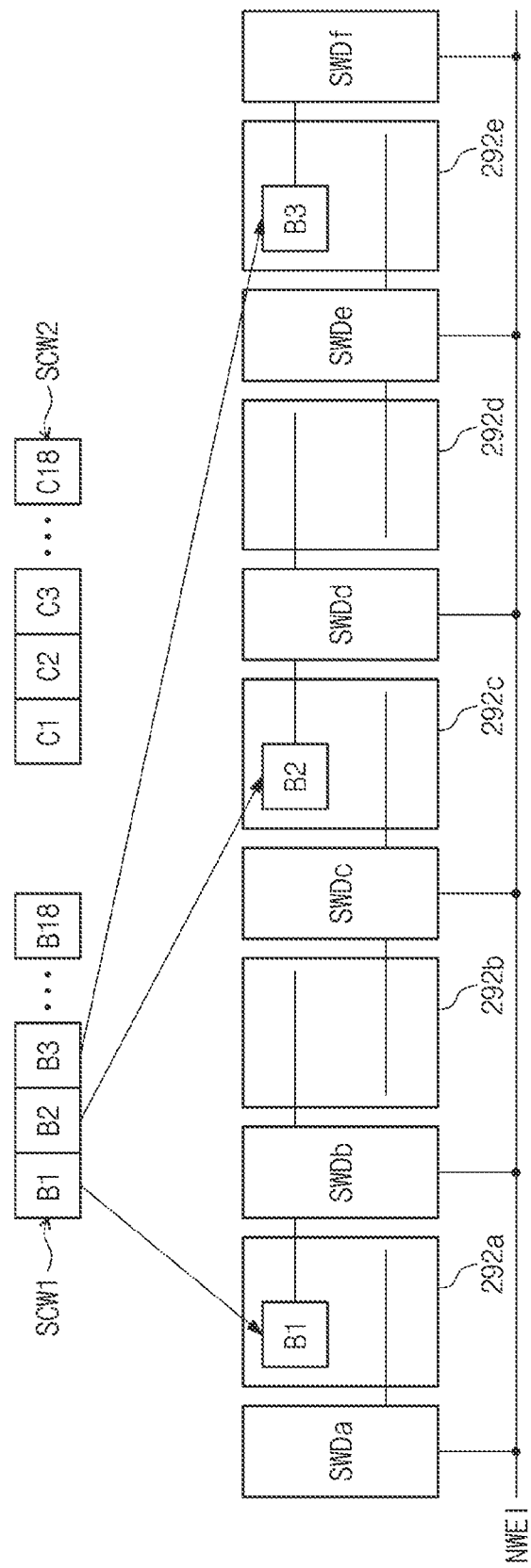
FIGS. 5, 6, 7, 8, 10, 11 and 12 are respective conceptual diagrams illustrating various examples of memory units writing (or attempting to write) sub-codeword(s) to a memory unit according to embodiments of the inventive concept.
Figure 6:
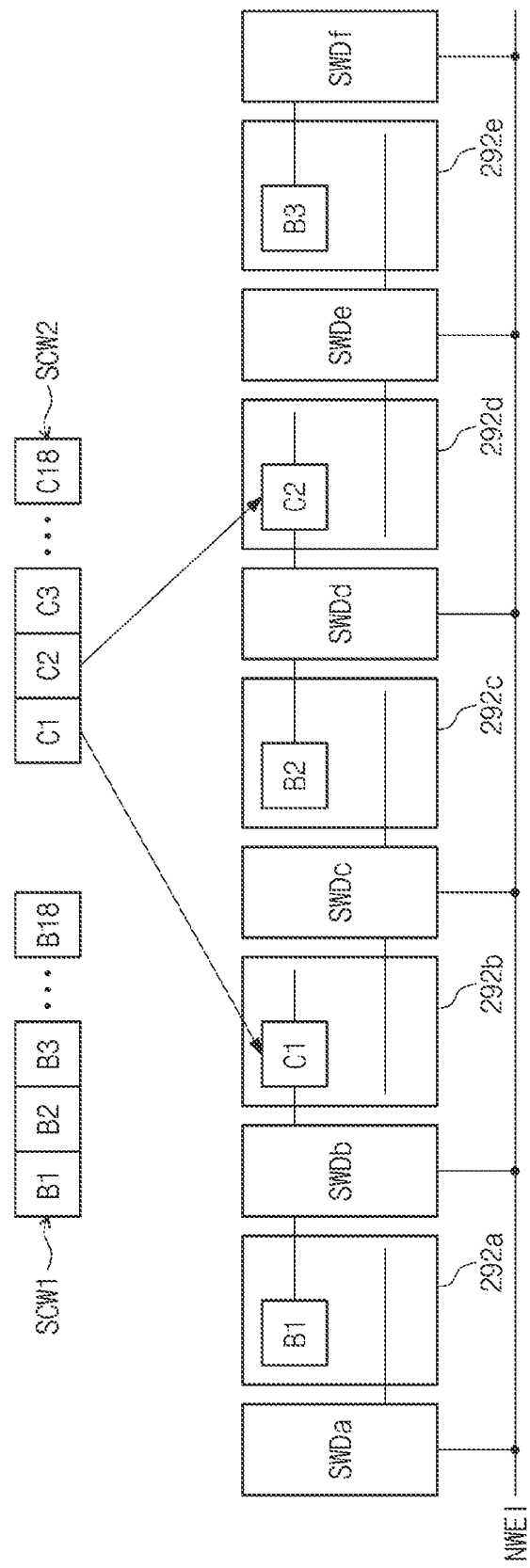

FIGS. 5 and 6 are respective, conceptual diagrams further illustrating an operation in which the memory unit 200 writes the first sub-codeword SCW1 and the second sub-codeword SCW2. Referring to FIGS. 2, 5 and 6, a signal line of a word line enable signal NWEI is assumed to extend in a transverse direction. Each of the sub-word line drivers SWDa to SWDf is assumed to be arranged along the transverse signal line, and cell arrays 292a to 292e are further assumed to be arranged between the sub-word line drivers SWDa to SWDf along the transverse signal line.

For the sake of clarity, only two (2) sub-word lines are illustrated in each of the cell arrays 292a to 292e, wherein each of the two sub-word lines is connected to memory cells.

In some embodiments, the memory unit 200 may alternately write the second data units (e.g., B1 to B18) of the first sub-codeword SCW1 and the third data units (e.g., C1 to C18) of the second sub-codeword SCW2. Cell arrays, numbering fewer than the number of data units, are shown in FIGS. 5 and 6, but the number of cell arrays may alternately be equal to or greater than the number of data units.

As illustrated in FIG. 5, the memory unit 200 may write the second data units (e.g., B1 to B18) of the first sub-codeword SCW1 in odd-numbered cell arrays 292a, 292c, and 292e, and as illustrated in FIG. 6, the memory unit 200 may write the third data units (e.g., C1 to C18) of the second sub-codeword SCW2 in even-numbered cell arrays 292b and 292d.

Figure 7:
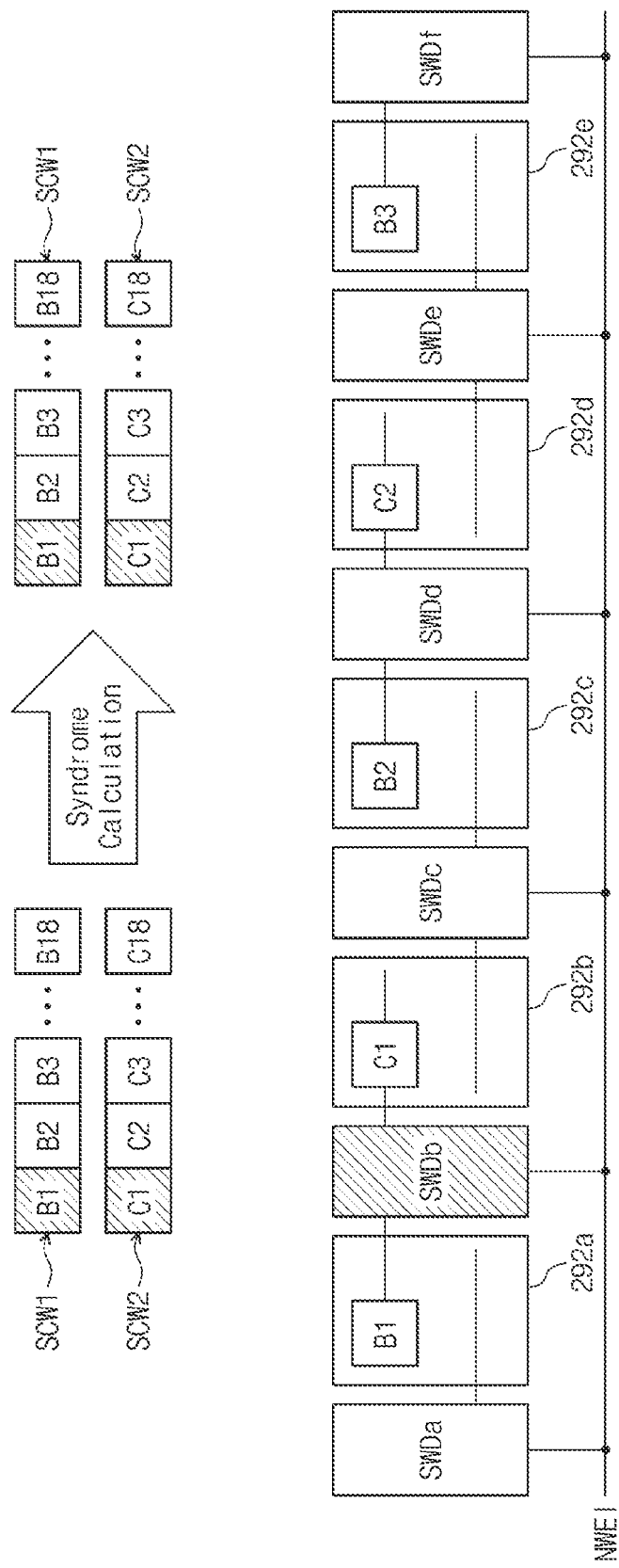

FIG. 7 is a conceptual diagram illustrating an example in which errors occur because a fault is present (e.g.,) in the sub-word line driver SWDb. Referring to FIGS. 4 and 7, when a fault is present in the sub-word line driver SWDb, errors may occur in a second data unit B1 of the first sub-codeword SCW1 and a third data unit C1 of the second sub-codeword SCW2, which are written in memory cells of sub-word lines connected with the sub-word line driver SWDb. (Here, the number "M" of data units corresponding to the errors is two from among the N data units, wherein 'N' and 'M' are positive integers and M is less than N).

However, here because it is assumed that each of the first error correction device 131 and the second error correction device 132 is able to correct an error of one data unit, locations of the errors may be accurately detected through a syndrome calculation. Accordingly, the errors may be corrected.

Figure 8:
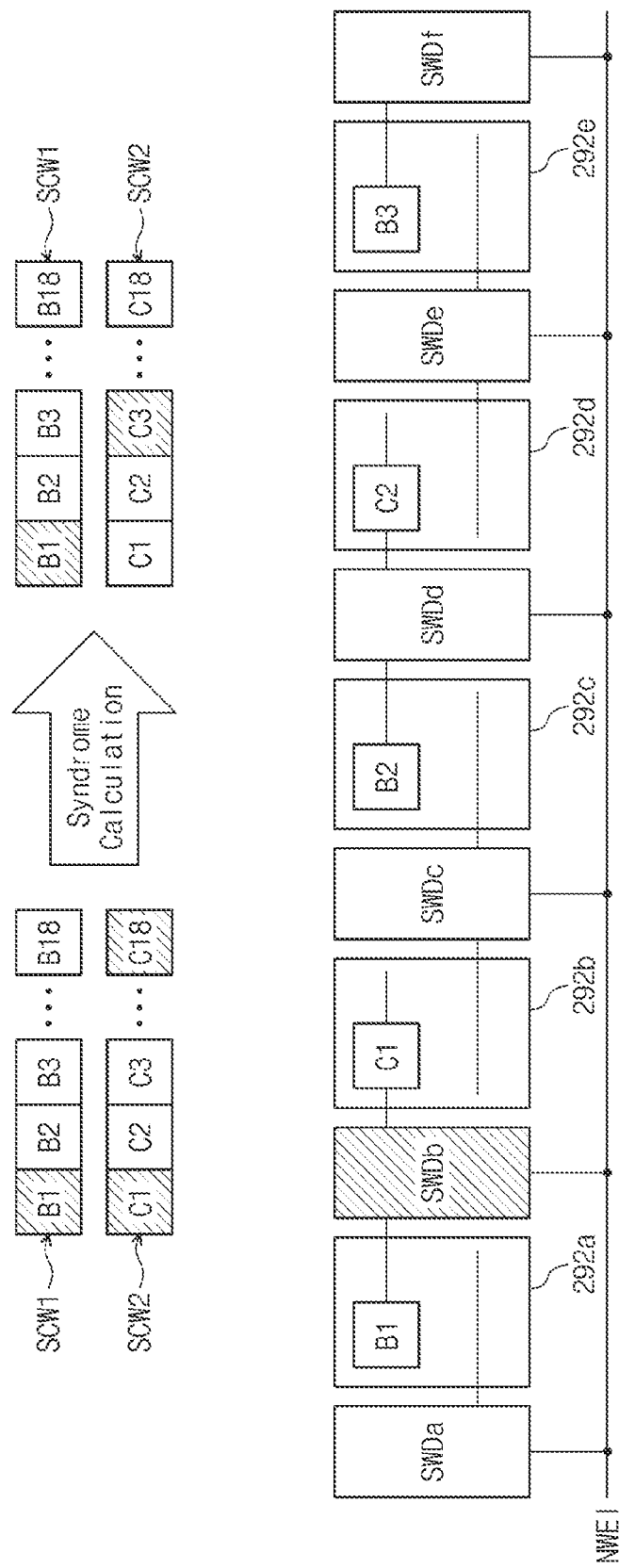

By way of comparison, FIG. 8 is another conceptual diagram illustrating an example in which a similar fault is present in the sub-word line driver SWDb and another error occurs. Thus, error correction must be attempted with the fault in the sub-word line driver SWDb and an additional error exists. Hence, because a fault is present in the sub-word line driver SWDb, errors occur in the second data unit B1 of the first sub-codeword SCW1 and the third data unit C1 of the second sub-codeword SCW2, which are written in memory cells of sub-word lines connected with the sub-word line driver SWDb.

In the illustrated example of FIG. 8, however, an additional (e.g., a random) error is assumed to occur in the third data unit C18 of the second sub-codeword SCW2. And as a result, the number of errors occurring in the second sub-codeword SCW2 exceeds the (assumed) maximum number of errors correctable by the second error correction device 132. Accordingly, when the syndrome calculation is performed on the second sub-codeword SCW2, a result indicating whether an error is present in any data unit of the second sub-codeword SCW2 may be erroneously determined.

That is, even though the second sub-codeword SCW2 includes a number of errors greater than the maximum number of correctable errors, the second error correction device 132 may determine that an error of the second sub-codeword SCW2 is correctable. In the illustrated case where the second error correction device 132 performs error correction, the first codeword CW1 being a result of error correction encoding is different from the original. This outcome is typical of SDC in that an uncorrectable error has not been recognized by the error correction module 130.

For example, a random error may an error occurring in data units at locations independent of a common component (e.g., a sub-word line driver), and not data units at locations correlated by the common component.

According to result of evaluating memory devices, when a correctable random error occurs, a first probability that the silent data corruption SDC occurs due to errors, the number of which exceeds the maximum number of correctable errors, may be markedly higher than a probability that a random error actually occurs, that is, a second probability that errors occur at memory cells of sub-word lines not connected with a common sub-word line driver.

Accordingly, when errors (e.g., random errors) occur in memory cells of sub-word lines not connected with a common component (e.g., a common sub-word line driver, the logic unit 120 may determine that the corresponding codeword suffers from SDC and may process the corresponding codeword as having an uncorrectable error. As such, it may be possible to prevent the memory device 100 from transmitting corrupted data to the external host device. Accordingly, a potentially fatal error may be prevented at the external host device, and overall reliability of the memory device 100 may be improved.

Alternately, when data units having errors correspond to a data corruption pattern, the logic unit 120 may process the corresponding codeword as having an uncorrectable error. For example, the data corruption pattern may be determined based on locations at which the memory unit 200 writes data units.

When the write method described with reference to FIGS. 5 and 6 is used, the data corruption pattern may mean that orders of data units having errors are not identical (or are not correlated—i.e., are independent). When the write method described with reference to FIGS. 5 and 6 is used, a data corruption pattern may be determined based on whether a sub-word line of a memory cell where a first data unit of the first sub-codeword SCW1 is written shares a sub-word line driver with another sub-word line.

As described with reference to FIG. 7, in the case where a sub-word line where the first data unit of the first sub-codeword SCW1 is written shares a sub-word line driver with another sub-word line, the data corruption pattern may mean that orders of data units having errors are not identical.

In FIG. 7, like sub-word lines where data units are not written, when a sub-word line where the first data unit of the first sub-codeword SCW1 does not share a sub-word line driver with another sub-word line, the data corruption pattern may mean that an order of a data unit that belongs to the second sub-codeword SCW2 and has an error is not advanced with respect to an order of a data unit that belongs to the first sub-codeword SCW1 and has an error, as much as "1".

Figure 9:
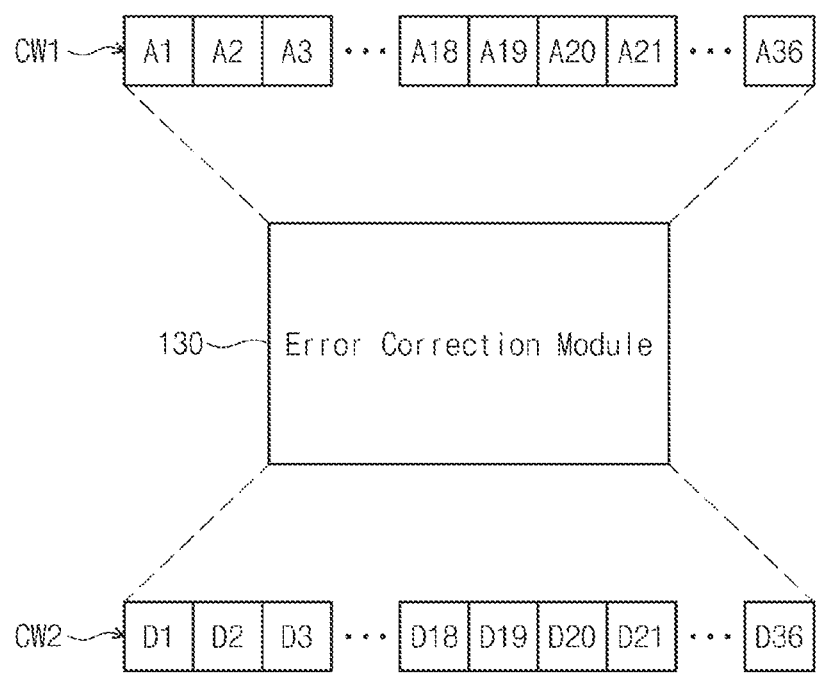

FIG. 9 is a conceptual diagram illustrating another example in which the error correction module 130 performs error correction encoding and error correction decoding according to embodiments of the inventive concept. Here again, the error correction module 130 may perform error correction encoding and error correction decoding using a Reed-Solomon code, for example.

The error correction module 130 may receive the first codeword CW1 including the first data units (e.g., A1 to A36) as the data signals DS. Each of the first data units may include (e.g.,) an 8-bit symbol. Alternately, each of the first data units may include one or more bits.

During the write operation, the error correction module 130 may perform error correction encoding on the first data units in order to generate a second codeword CW2 including fourth data units (e.g., D1 to D36). The logic unit 120 may transmit the second codeword CW2 to the memory units 110 as the internal data signals iDS, wherein one of the memory units 110 may store the second codeword CW2.

During the read operation, the logic unit 120 may receive the second codeword CW2 from the memory units 110. The error correction device 130 may perform error correction decoding on the fourth data units (e.g., D1 to D36) of the second codeword CW2 in order to regenerate the first data units (e.g., A1 to A36).

In some embodiments, the error correction module 130 may detect and correct errors of two (2) data units of the (assumed) 36 data units. However, the number of data units that the error correction module 130 may correct is not limited thereto, and the number of data units that the error correction module 130 may correct may be any reasonable number greater than 2.

Here again, parity data may be added in the process of performing error correction encoding.

Figure 10:
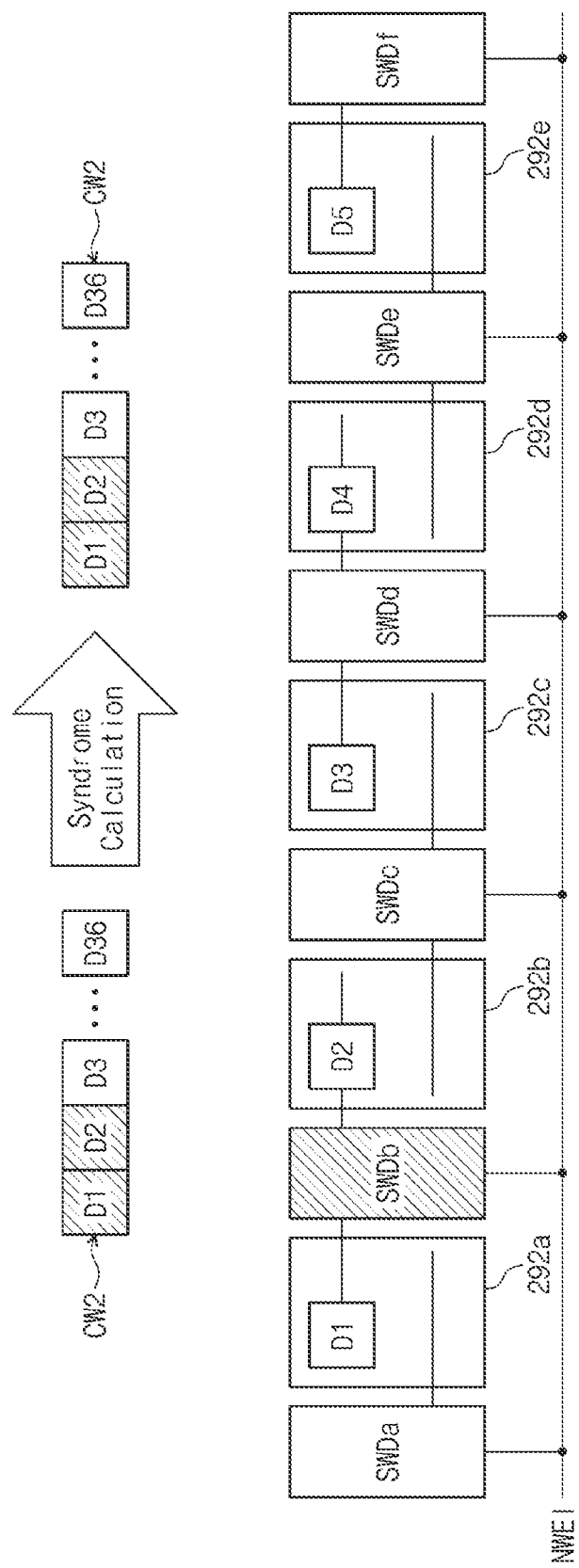

FIG. 10 is a conceptual diagram illustrating an example in which error correction is attempted when a fault is present in the sub-word line driver SWDb. Referring to FIGS. 2, 9, and 10, the memory unit 200 is assumed to sequentially write data units of the second codeword CW2 in the arrays 292*a*, 292*b*, 292*c*, 292*d*, and 292*e*.

Hence, when a fault is present in the sub-word line driver SWDb, errors may occur in the fourth data units D1 and D2 of the second codeword CW2. When data units having errors correspond to a common component (e.g., a common sub-word line driver), the errors may be processed as correctable.

As described with reference to FIG. 8, when the number of errors of the second codeword CW2 is greater than a maximum number of errors correctable by the error correction module 130, a result indicating that two data units at any locations have errors may be drawn through syndrome calculation.

Accordingly, when errors occur at memory cells of sub-word lines not connected with a common component (e.g., a common sub-word line driver), the logic unit 120 may process the corresponding codeword as having an uncorrectable error. As such, it is possible to prevent the memory device 100 from transmitting corrupted data to the external host device. Accordingly, a fatal error may be prevented at the external host device, thereby improving the reliability of the memory device 100.

Alternatively, when data units having errors correspond to a data corruption pattern, the logic chip 120 may process the corresponding codeword as having an uncorrectable error. For example, the data corruption pattern may be determined based on locations at which the memory chip 200 writes data units.

When the write method described with reference to FIG. 10 is used, the data corruption pattern may mean that orders of data units having errors are not continuous. And when the write method described with reference to FIG. 10 is used, the data corruption pattern may be determined based on whether a sub-word line of a memory cell where a first data unit of the second codeword CW2 is written shares a sub-word line driver with another sub-word line.

As described with reference to FIG. 10, in the case where the sub-word line where the fourth data unit of the second codeword CW2 is written shares a sub-word line driver with another sub-word line, the data corruption pattern may mean that data units having errors are continuous and a data unit having an odd-numbered error is not advanced with respect to a data unit having an even-numbered error.

In FIG. 10, like sub-word lines where data units are not written, in the case where the sub-word line where the fourth data unit of the second codeword CW2 is written does not share a sub-word line driver with another sub-word line, the data corruption pattern may mean that data units having errors are continuous and a data unit having an even-numbered error is not advanced with respect to a data unit having an odd-numbered error.

Figure 11:
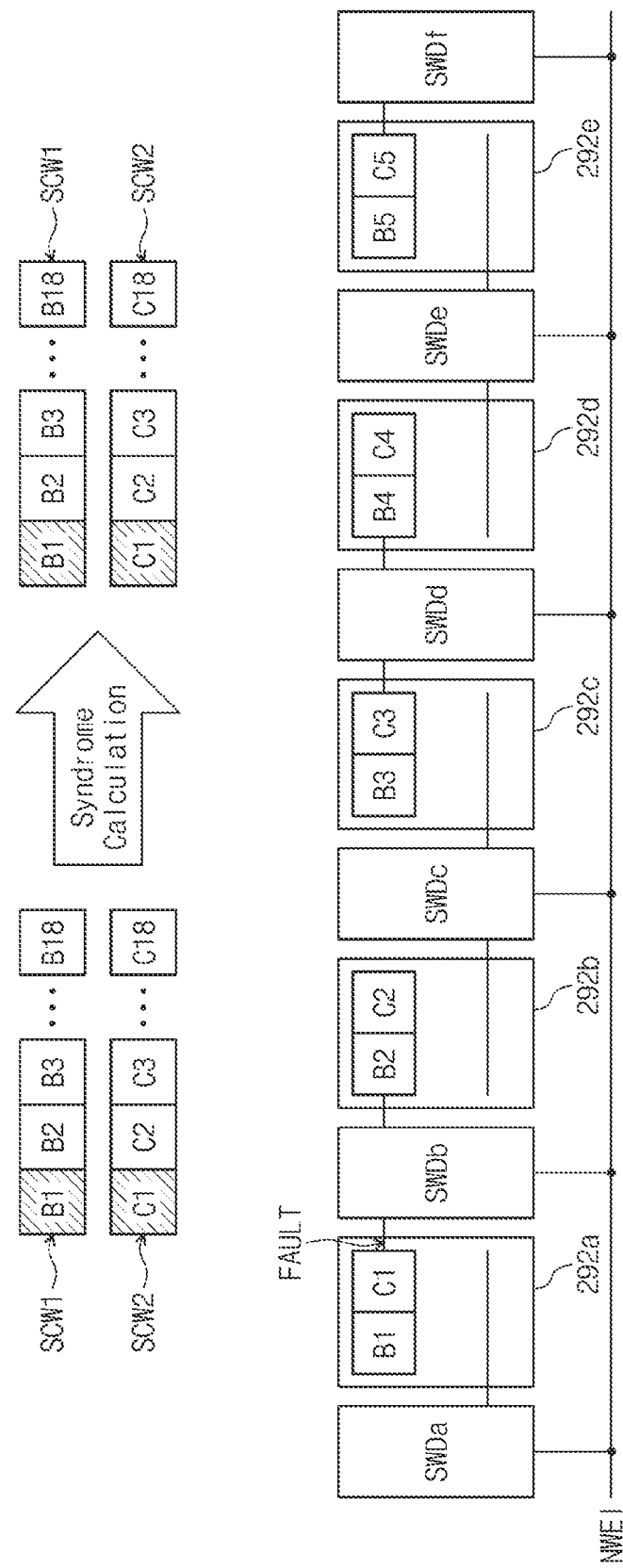

FIG. 11 is another conceptual diagram illustrating an example in which error correction is attempted when a fault is present in a sub-word line. Referring to FIGS. 2, 4, and 11, the memory unit 200 may write one data unit of the first sub-codeword SCW1 and one data unit of the second sub-codeword SCW2 in each of the cell arrays 292*a*, 292*b*, 292*c*, 292*d*, and 292*e*.

When a fault is present in one sub-word line connected with the sub-word line driver SWDb, errors may occur in the second data unit B1 of the first sub-codeword SCW1 and the third data unit C1 of the second sub-codeword SCW2. When data units having errors correspond to a common component, that is, a common sub-word line, the errors may be processed as correctable.

As described with reference to FIG. 8, when the number of errors of the second codeword CW2 is greater than a maximum number of errors correctable by the error correction module 130, a result indicating that two data units at any locations have errors may be drawn through syndrome calculation.

Accordingly, when errors occur at memory cells not connected with a common component, that is, a common sub-word line, the logic unit 120 may process the corresponding codeword as having an uncorrectable error. As such, it may be possible to prevent the memory device 100 from transmitting corrupted data to the external host device. Accordingly, a fatal error may be prevented at the external host device, thereby improving the reliability of the memory device 100.

Alternately, when data units having errors correspond to a data corruption pattern, the logic unit 120 may process the corresponding codeword as having an uncorrectable error. For example, the data corruption pattern may be determined based on locations at which the memory unit 200 writes data units.

When the write method described with reference to FIG. 11 is used, the data corruption pattern may mean that orders of data units having errors are not identical. For example, the case where a location of a second data unit that has an error and belongs to the first sub-codeword SCW1 is different from a location of a third data unit that has an error and belongs to the second sub-codeword SCW2 may be determined as corresponding to a data corruption pattern.

Figure 12:
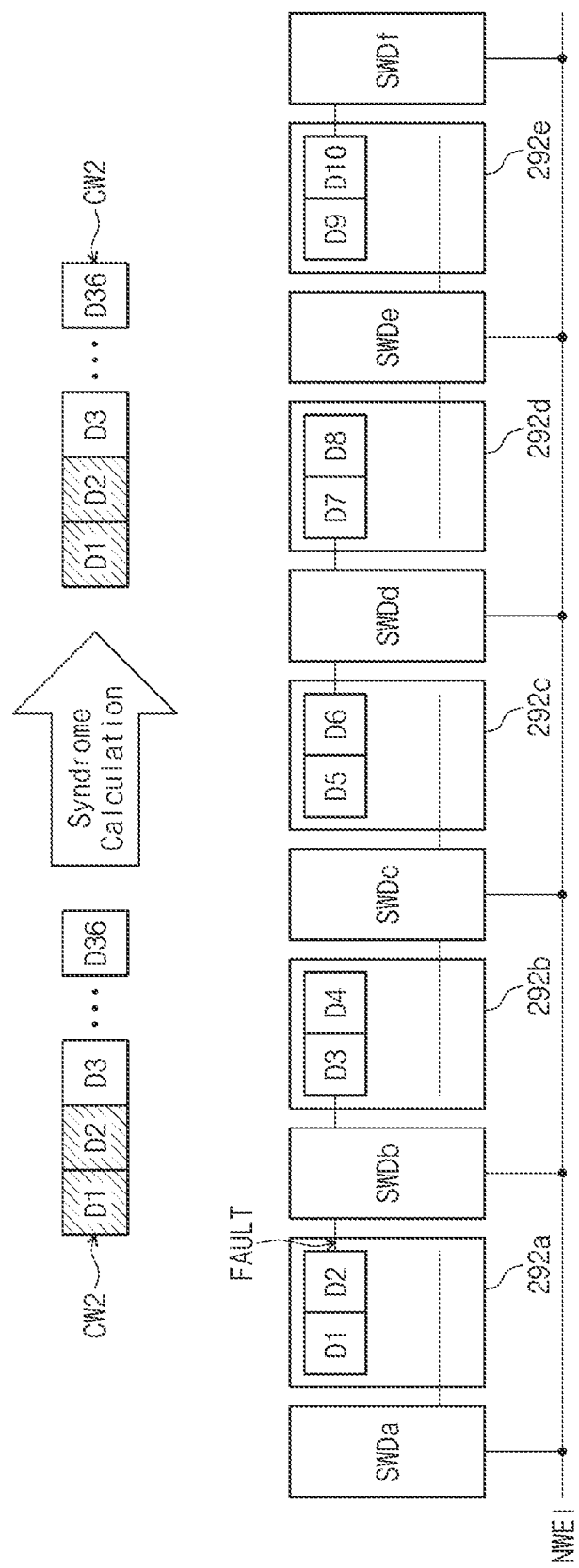

FIG. 12 is still another conceptual diagram illustrating an example in which error correction is attempted when a fault is present in a sub-word line. Referring to FIGS. 2, 9, and 12, the memory chip 200 may write two data units of the second codeword CW2 in each of the cell arrays 292*a*, 292*b*, 292*c*, 292*d*, and 292*e*.

When a fault is present in one sub-word line connected with the sub-word line driver SWDb, errors may occur in the fourth data units D1 and D2 of the second codeword CW2. When data units having errors correspond to a common component, that is, a common sub-word line, the errors may be processed as correctable.

As described with reference to FIG. 8, when the number of errors of the second codeword CW2 is greater than a maximum number of errors correctable by the error correction module 130, a result indicating that two data units at any locations have errors may be drawn through syndrome calculation.

Accordingly, when errors occur at memory cells not connected with a common component, that is, a common sub-word line, the logic unit 120 may process the corresponding codeword as having an uncorrectable error. As such, it may be possible to prevent the memory device 100 from transmitting corrupted data to the external host device. Accordingly, a fatal error may be prevented from occurring at the external host device. Accordingly, a reliability of the memory device 100 is improved.

Alternately, when data units having errors correspond to a data corruption pattern, the logic unit 120 may process the corresponding codeword as having an uncorrectable error. For example, the data corruption pattern may be determined based on locations at which the memory unit 200 writes data units.

When the write method described with reference to FIG. 12 is used, the data corruption pattern may mean that orders of data units having errors are not continuous. For example, the data corruption pattern may mean that data units having errors are continuous and a data unit having an odd-numbered error is not advanced with respect to a data unit having an even-numbered error.

As described with collective reference to FIGS. 7 to 12, the determination of a common component, as used above, may vary depending on the manner in which the memory unit 200 writes data units, as well as the maximum number of errors correctable by the error correction module 130.

When the memory unit 200 writes data units corresponding to the maximum number of correctable errors in two cell arrays, a common component may be a sub-word line driver. When the memory unit 200 writes data units corresponding to the maximum number of correctable errors in one cell array, a common component may be a sub-word line. When the memory unit 200 distributes and writes data units corresponding to the maximum number of correctable errors in all the cell arrays, a common component may be a word line (or a word line driver or a word line enable signal line).

Figure 13:
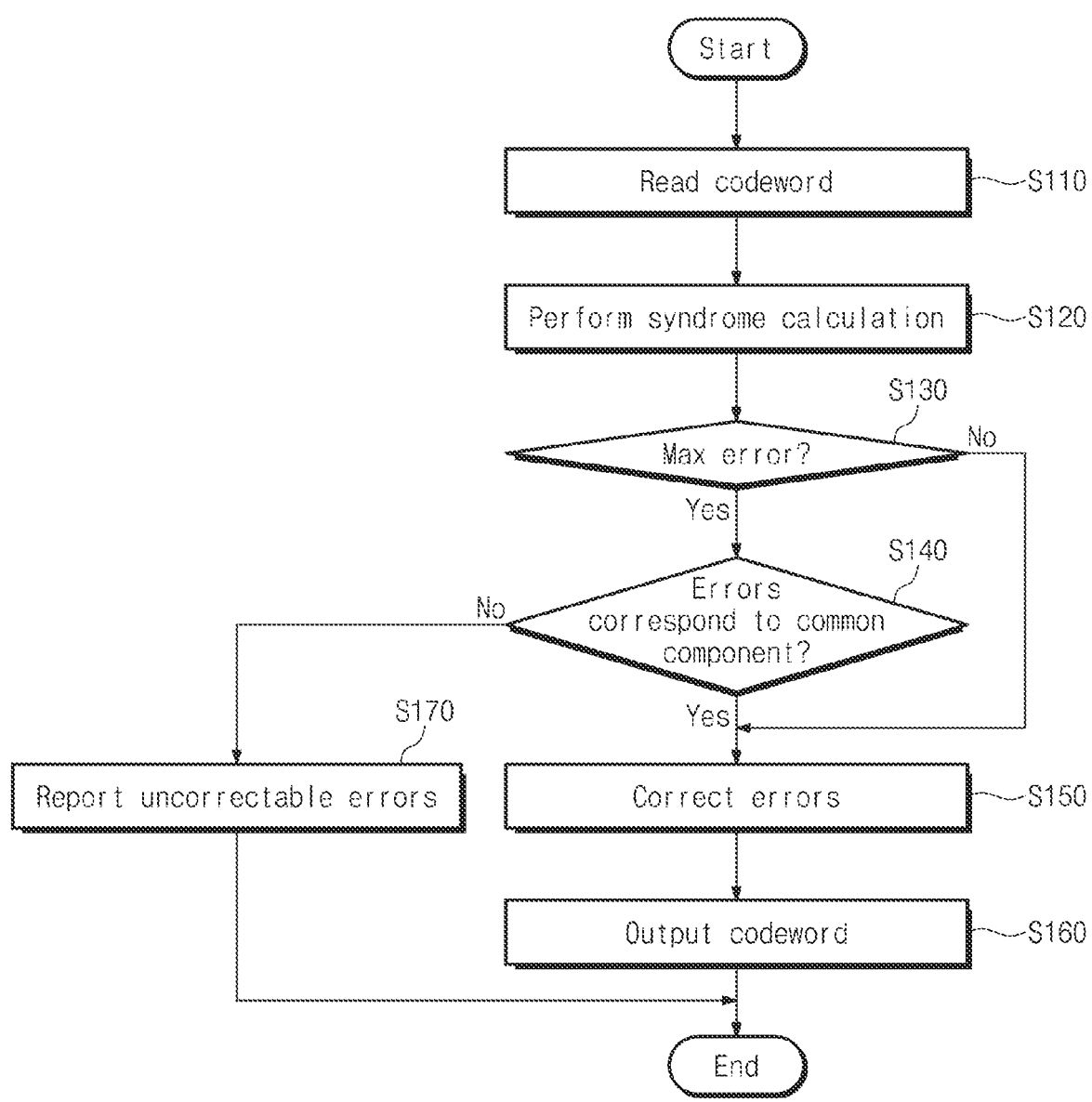
FIG. 13 is a flowchart summarizing in one example a method of reading data from a memory device according to embodiments of the inventive concept.

FIG. 13 is a flowchart summarizing a method of reading data in the memory device 100 of FIG. 1 according to embodiments of the inventive concept. Referring to FIG. 13, the logic unit 120 may read a codeword from one of the memory units 110 as the internal data signals iDS (S110). Then, the logic unit 120 may perform a syndrome calculation on the codeword using the error correction module 130 (S120).

The logic unit 120 may determine whether the number of errors calculated by the syndrome calculation corresponds to a maximum (Max) number of errors that are correctable using the error correction module (S130). When it is determined that the number of errors calculated does not correspond to the maximum number of errors (S130=NO), the logic unit 120 may correct one or more error(s) using the error correction module 130 (S150), and an error-corrected codeword may be provided to the external host device as the data signals DS (S160).

However, when it is determined that the number of errors calculated by the syndrome calculation equals the maximum number of errors (S130=YES), the logic unit 120 may determine whether the errors correspond to a common component (S140). In this regard, the logic unit 120 may also determine whether the errors do not correspond to a data corruption pattern. As described above, a common component and/or a data corruption pattern may be variously determined based on a way in which the memory unit 200 writes data units and/or the maximum number of errors correctable by the error correction module 130.

When it is determined that the errors correspond to a common component or do not correspond to a data corruption pattern (S140=YES), the logic unit 120 may correct the error(s) using the error correction module 130 (S150) and provide an error-corrected codeword to the external host device as the data signals DS (S160).

Else, when it is determined that the errors do not correspond to a common component or correspond to a data corruption pattern (S140=NO), the logic unit 120 may report that uncorrectable errors have occurred in the codeword to the external host device (S170). In some embodiments, the logic unit 120 may report an error using a portion of the data signals DS or a portion of the first control signals CS1 and the third control signals CS3, as described in relation to FIG. 1.

Alternately, and not illustrated in FIG. 13, when it is determined that the number of errors exceeds the maximum number of correctable errors, the logic unit 120 may report an uncorrectable error. The method of FIG. 13 may be applied when there occur errors, the number of which does not exceed the maximum number of correctable errors.

Figure 14:
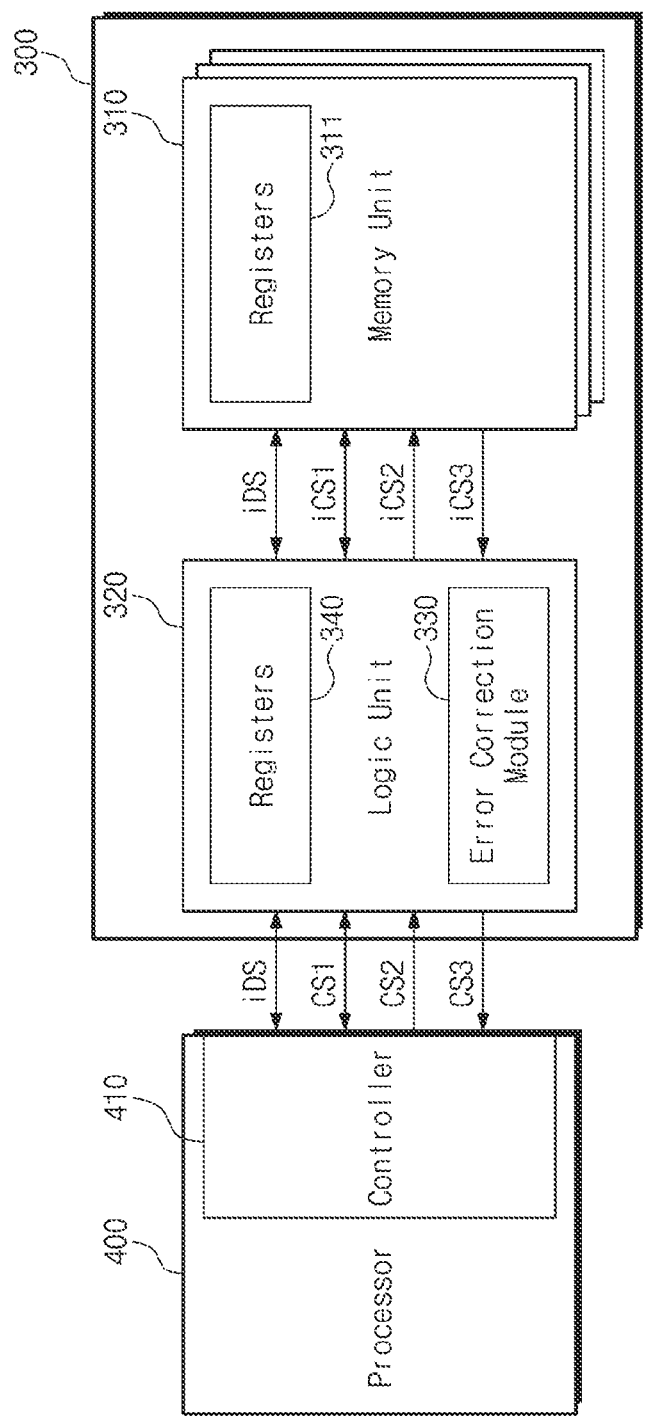

FIG. 14 is a block diagram illustrating a computing device according to embodiments of the inventive concept. Referring to FIG. 14, the computing device may include a memory device 300 and a processor 400. The memory device 300 may include memory units 310 and a logic unit 320.

The memory units 310 may be the same as the memory units 110 of FIG. 1, except that the memory units 310 include registers 311. The registers 311 may store settings associated with operations or modes of the memory units 310. The registers 311 may include mode registers.

The logic unit 320 may be identical to the logic unit 120 of FIG. 1 except that the logic unit 320 includes registers 340. The registers 340 may store settings associated with operations or modes of the memory device 300. The registers 340 may include mode registers.

The processor 400 may function as the external host device described in relation to FIG. 1. The processor 400 may include a general-purpose processor, an application processor, a special-purpose processor, etc. The processor 400 may include a controller 410 that communicates with the memory device 300 and controls the memory device 300. The controller 410 may access the memory device 300 using (e.g.,) an established synchronous dynamic random access (SRAM) standard.

The controller 410 may control the operation of the memory device 300 by setting or updating information stored in the registers 311 or the registers 340. In particular, the controller 410 may control operation associated with the SDC by setting or updating information stored in the registers 311 or the registers 340.

For example, the controller 410 may activate/deactivate an SDC preventing operation, like th eons described with reference to FIGS. 4 to 13, by setting or updating information stored in the registers 311 or the registers 340. When the SDC preventing operation is activated, the memory device 300 may read data in accordance with a method like the one described with reference to FIG. 13. When the SDC preventing operation is deactivated, the memory device 300 may correct all errors, some long as the number of error does not exceed the maximum number of correctable errors.

Figure 15:
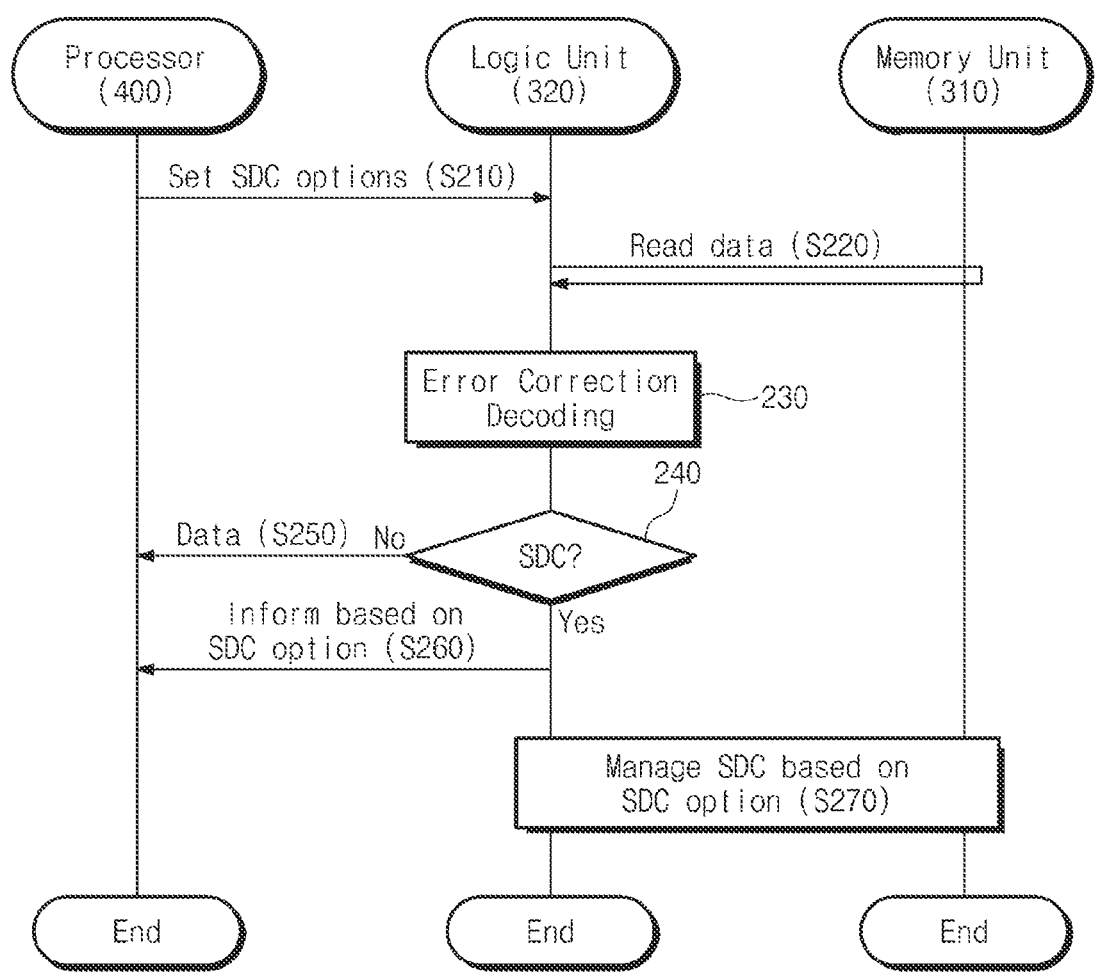
FIG. 15 is a flow diagram illustrating an example in which a processor sets an SDC preventing operation of a memory device when the SDC preventing operation is activated.

FIG. 15 is a flow diagram illustrating an example in which the processor 400 of FIG. 14 sets an SDC preventing operation in the memory device 300 when the SDC preventing operation is activated. Referring to FIGS. 14 and 15, the processor 400 may set options of the SDC preventing operation of the memory device 300 (S210).

For example, options may include one or more settings respectively or collectively associated with one or more of the following: (1) whether the memory device 300 may report an uncorrectable error; (2) whether the memory device 300 may report an uncorrectable error of an SDC type when the SDC occurs; (3) whether to report an address where the SDC occurs; (4) activation/deactivation of an operation in which the memory device 300 may automatically manage SDC; (5) whether the memory device 300 stores the address where the SDC occurs, when an SDC management operation of the memory device 300 is activated; (6) whether to refuse access to the address where the SDC occurs, when the SDC management operation of the memory device 300 is activated; (7) whether to count a number of times that the SDC is repeated at a specific address, when the SDC management operation of the memory device 300 is activated; (8) whether to perform an additional report based on a count value of the SDC, when the SDC management operation of the memory device 300 is activated; (9) whether to refuse access to the corresponding address based on the count value of the SDC, when the SDC management operation of the memory device 300 is activated; etc.

Here, when SDC is repeated at a specific address—a fault may exist in a word line. Accordingly, it may be possible to prevent additional incidents of SDC by refusing access to the specific address.

Referring to FIG. 15, the options associated with the SDC preventing operation may be performed upon initializing the computing device. Thus, the logic unit 320 may read data from the memory unit 200 (S220), and afterwards, the logic unit 320 may perform error correction decoding using an error correction module 330 (S230).

The logic unit 320 may determine whether SDC has occurred (S240). And when SDC has not occurred (S240=NO), the logic unit 320 may output data to the processor 400 (S250). However, when SDC has occurred, the logic unit 320 may report the SDC to the processor 400 based on the SDC options (S260). Afterwards, when the SDC management operation of the memory device 300 is activated, the memory device 300 may perform the SDC management operation based on the options (S270).

In the foregoing embodiments, components according to the inventive concept may have been described in terms of "first", "second", "third", and the like. However, such terms are merely used to distinguish different components and are not meant to specifically enumerate components.

Various components according to embodiments of the inventive concept are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to the inventive concept, when a risk of SDC is detected, a memory device may process data as having an uncorrectable error. Accordingly, it is possible to prevent data from being corrupted by the SDC and a fatal error from occurring at a system including the memory device due to corrupted data.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory device, comprising:
a memory chip including memory cells; and
a logic chip configured to control the memory chip,
wherein the logic chip reads a codeword including N data units from the memory chip, and perform error correction decoding on the codeword to correct errors in M data units of the N data units, such that when the M data units correspond to a common hardware component specific to a sub-word line which connects memory cells of the memory chip, the logic chip is configured to correct the errors of the M data units by flipping bits of the errors of the M data units, and when the M data units do not correspond to the common hardware component of the memory chip, the logic chip is configured to process the errors of the M data units as an uncorrectable error,
N is a positive integer, and
M is a positive integer less than N,
wherein the logic chip includes:
a first error correction device configured to perform a first error correction encoding on a portion of the codeword to generate a first sub-codeword; and
a second error correction device configured to perform a second error correction encoding on a remaining portion of the codeword to generate a second sub-codeword.

2. The memory device of claim 1, wherein the memory chip includes:
a sub-word line connected to the memory cells;
a sub-word line driver configured to drive the sub-word line;
a word line connected to the sub-word line driver; and
a row decoder connected with the word line, and
the common hardware component is the sub-word line driver.

3. The memory device of claim 1, wherein the memory chip includes:
a sub-word line connected to the memory cells;
a sub-word line driver configured to drive the sub-word line;
a word line connected to the sub-word line driver; and
a row decoder connected with the word line, and
the common hardware component is the sub-word line.

4. The memory device of claim 1, wherein, processing of the uncorrectable error includes outputting a signal to an external host device indicating that the uncorrectable error has occurred.

5. The memory device of claim 4, wherein the logic chip is configured to communicate with the external host device through data lines and control signal lines, and
the logic chip outputs the signal to the external host device through at least one of the data lines.

6. The memory device of claim 4, wherein the logic chip is configured to communicate with the external host device through data lines and control signal lines, and
the logic chip outputs the signal to the external host device through at least one of the control signal lines.

7. The memory device of claim 1, wherein each of the N data units includes an 8-bit symbol.

8. The memory device of claim 1, wherein N=36.

9. The memory device of claim 1, wherein M=2.

10. The memory device of claim 1, wherein the logic chip is configured to manage the uncorrectable error based on at least one option defined by an external host device.

11. The memory device of claim 10, wherein the at least one option includes a setting associated with whether to process the errors of the M data units as the uncorrectable error, or whether to correct the errors of the M data units when the M data units do not correspond to the common hardware component of the memory chip.

12. The memory device of claim 10, wherein the at least one option includes a setting associated with whether to output to the external host device information indicating that the uncorrectable error occurs or information indicating that the uncorrectable error occurs due to no correspondence to the common hardware component and the M data units do not correspond to the common hardware component of the memory chip.

13. The memory device of claim 10, wherein the at least one option includes a setting associated with whether the logic chip stores addresses of the M data units.

14. The memory device of claim 13, wherein the at least one option further includes a setting associated with whether the logic chip refuses an access to the addresses of the M data units.

15. A method for accessing a memory device including memory cells, the method comprising:
  reading a codeword from the memory cells;
  correcting errors when a number of the errors in the codeword is less than a maximum number of correctable errors;
  correcting errors by flipping bits of the errors when the number of errors in the codeword is equal to the maximum number of correctable errors and the errors correspond to a same sub-word line;
  outputting a signal indicating that the errors are an uncorrectable error when the number of errors of the codeword is equal to the maximum number of correctable errors and the errors correspond to different sub-word lines;
  receiving a second codeword;
  performing a first error correction encoding on a portion of the second codeword to generate a first sub-codeword; and
  performing a second error correction encoding on a remaining portion of the second codeword to generate a second sub-codeword.

16. The method of claim 15, further comprising:
  writing the first sub-codeword and the second sub-codeword in the memory cells as the codeword by writing a first data unit of the first sub-codeword in first memory cells connected with a first sub-word line from among the memory cells, and writing a second data unit of the second sub-codeword in second memory cells connected with the first sub-word line from among the memory cells.

* * * * *